(12) United States Patent
Park (10) Patent No.: US 10,656,180 B2
(45) Date of Patent: May 19, 2020

(54) TEST DEVICE

(71) Applicant: LEENO INDUSTRIAL INC., Busan (KR)

(72) Inventor: Ung-gi Park, Seoul (KR)

(73) Assignee: LEENO INDUSTRIAL INC. (KR)

( * ) Notice: Subject to any disclaimer, the term of this patent is extended or adjusted under 35 U.S.C. 154(b) by 32 days.

(21) Appl. No.: 16/047,389

(22) Filed: Jul. 27, 2018

(65) Prior Publication Data
US 2019/0041430 A1    Feb. 7, 2019

(30) Foreign Application Priority Data

Aug. 4, 2017    (KR) .................... 10-2017-0099057

(51) Int. Cl.
*G01R 1/073*    (2006.01)
*G01R 1/067*    (2006.01)

(52) U.S. Cl.
CPC ..... *G01R 1/07371* (2013.01); *G01R 1/06716* (2013.01); *G01R 1/06738* (2013.01); *G01R 1/07342* (2013.01); *G01R 1/07357* (2013.01)

(58) Field of Classification Search
CPC ............ G01R 1/07371; G01R 1/07357; G01R 1/07342; G01R 1/06738; G01R 1/06716
USPC ...... 324/754.1, 500, 754.03, 754.01, 754.13, 324/754.18, 756.03, 756.04, 757.04, 324/757.05, 754.2
See application file for complete search history.

(56) References Cited

U.S. PATENT DOCUMENTS

2010/0327894 A1* 12/2010 Dang ................. G01R 1/06738
                                                              324/755.11
2015/0280345 A1* 10/2015 Kimura .............. H01R 13/2428
                                                              439/700

FOREIGN PATENT DOCUMENTS

| KR | 10-2003-0094820 A | 12/2003 |
| KR | 10-2009-0030543 A | 3/2009 |
| KR | 10-2011-0085461 A | 7/2011 |
| KR | 10-2015-0115728 A | 10/2015 |
| KR | 10-2016-0063268 A | 6/2016 |

OTHER PUBLICATIONS

Korean Office Action (KR-10-2017-0099057), KIPO, dated Aug. 9, 2018.
Korean Decision to Grant ( KR-10-2017-0099057), KIPO, dated Dec. 8, 2018.

* cited by examiner

*Primary Examiner* — Melissa J Koval
*Assistant Examiner* — Trung Nguyen
(74) *Attorney, Agent, or Firm* — Park & Associates IP Law, P.C.

(57) ABSTRACT

A test device for testing electric characteristics of an object to be tested. The test device includes: a first support member comprising a plurality of guide holes; a second support member comprising a plurality of terminal holes and arranged to be spaced apart from and in parallel with the first support member; a plurality of main contact probes; and a plurality of sub contact probes arranged to be adjacent to the main contact probes along a lengthwise direction. According to the present disclosure, contact reliability is improved by multi contact with the terminal of the test circuit board (interposer) and/or the object to be tested.

4 Claims, 6 Drawing Sheets

TEST DEVICE

REFERENCE TO RELATED APPLICATIONS

This application claims the priority benefit of Korean Patent Application No. 10-2017-0099057 filed on Aug. 4, 2017, the entire contents of which are incorporated herein by reference.

FIELD OF THE INVENTION

The present disclosure relates to a test device for testing electric characteristics of a semiconductor or the like object to be tested.

BACKGROUND OF THE INVENTION

As a test device for testing electric characteristics of a semiconductor wafer or the like object to be tested, a probe card including a plurality of probes for electrical connection between a tested contact point of the object to be tested and a testing contact point of a test circuit has been used.

With development of technology, the semiconductor wafer has become larger and a semiconductor has become smaller. As the number of semiconductor pads formable on one sheet of semiconductor wafer increases, a distance between semiconductor pads gets closer. Like this, a higher-density probe card is required as a pitch between the pads becomes narrower.

In general, the probe card is mounted with so many microelectromechanical system (MEMS) probes in high density. During the test, the probe keeps one contact portion in contact with and pressed against a terminal of an object to be tested, and thus an elastic deformation portion is deformed in a certain direction. In this case, the other contact portion slides and moves in an opposite direction to the deforming direction of the elastic deformation portion on the pad of the test circuit, and therefore a problem arises in that the contact is not sure. Further, the conventional MEMS type probe card is diagnosed as the whole failures or defects of the probe card even when just one among the plurality of MEMS probes is defective or damaged in the contact portion as repetitively used in the test. Besides, the contact portion of the MEMS probe to be in contact with the tested contact points of the object to be tested may be increased in contact resistance as a contact tip is worn or contaminated by the repetitive tests, thereby lowering test reliability.

A conventional probe card includes a first support member and a second support member arranged in parallel with each other leaving a space therebetween and supporting a plurality of MEMS probes. During the test, one contact portion of the plurality of MEMS probes is pressed against an object to be tested and slides and moves in a pressing direction, and the other contact portion is in contact with a contact point of a test circuit board (or an interposer), while a middle elastic deformation portion is deformed in a designated direction. In this case, a support member for supporting the other contact portion is urged in a deforming direction by the deformation of the elastic deformation portion. When the support member is excessively urged by so many MEMS probes, it has a bad effect on a contact test of an adjacent test probe and thus lowers test reliability.

SUMMARY OF THE INVENTION

An aspect of the present disclosure is conceived to solve the conventional problems, and provide a test device improved in test reliability by lowering contact resistance and reducing a contact error.

Another aspect of the present disclosure is to provide a test device improved in test reliability by minimizing an effect of deformation of a test probe on a support member for supporting the test probe.

In accordance with an embodiment of the present disclosure, there is provided a test device. The test device comprises: a first support member comprising a plurality of guide holes; a second support member comprising a plurality of terminal holes and arranged to be spaced apart from and in parallel with the first support member; a plurality of main contact probes each comprising a main sliding contact portion to be slidably inserted in the guide hole, a main terminal contact portion to be inserted in the terminal hole, and a main elastic deformation portion connecting the main sliding contact portion and the main terminal contact portion and elastically deformed by compression of a lengthwise direction; and a plurality of sub contact probes each comprising a sub sliding contact portion to be adjacent to the main sliding contact portion and slidably inserted in the guide hole, a sub terminal contact portion to be adjacent to the main terminal contact portion and inserted in the terminal hole, and a sub elastic deformation portion connecting the sub sliding contact portion and the sub terminal contact portion, arranged to be adjacent to the main elastic deformation portion and elastically deformed by compression of a lengthwise direction. According to the present disclosure, a plurality of probe tips are in contact with a terminal of an object to be tested or a pad of an interposer during a test, thereby improving contact reliability and lowering contact resistance.

The main terminal contact portion and the sub terminal contact portion may be separated by a first slot along a lengthwise direction.

The main elastic deformation portion and the sub elastic deformation portion may be separated by a second slot along a lengthwise direction.

The main sliding contact portion and the sub sliding contact portion may be separated by a third slot along a lengthwise direction.

The main contact probe and the sub contact probe may comprise an engagement portion positioned within thickness of at least one of the first support member and the second support member and engaged with each other in a lengthwise direction.

The sub contact probe may be compressed by the engagement portion within the thickness of at least one of the first support member and the second support member when the main contact probe is compressed.

BRIEF DESCRIPTION OF THE DRAWINGS

The above and/or other aspects will become apparent and more readily appreciated from the following description of exemplary embodiments, taken in conjunction with the accompanying drawings, in which.

DETAILED DESCRIPTION OF THE INVENTION

Figure 1:
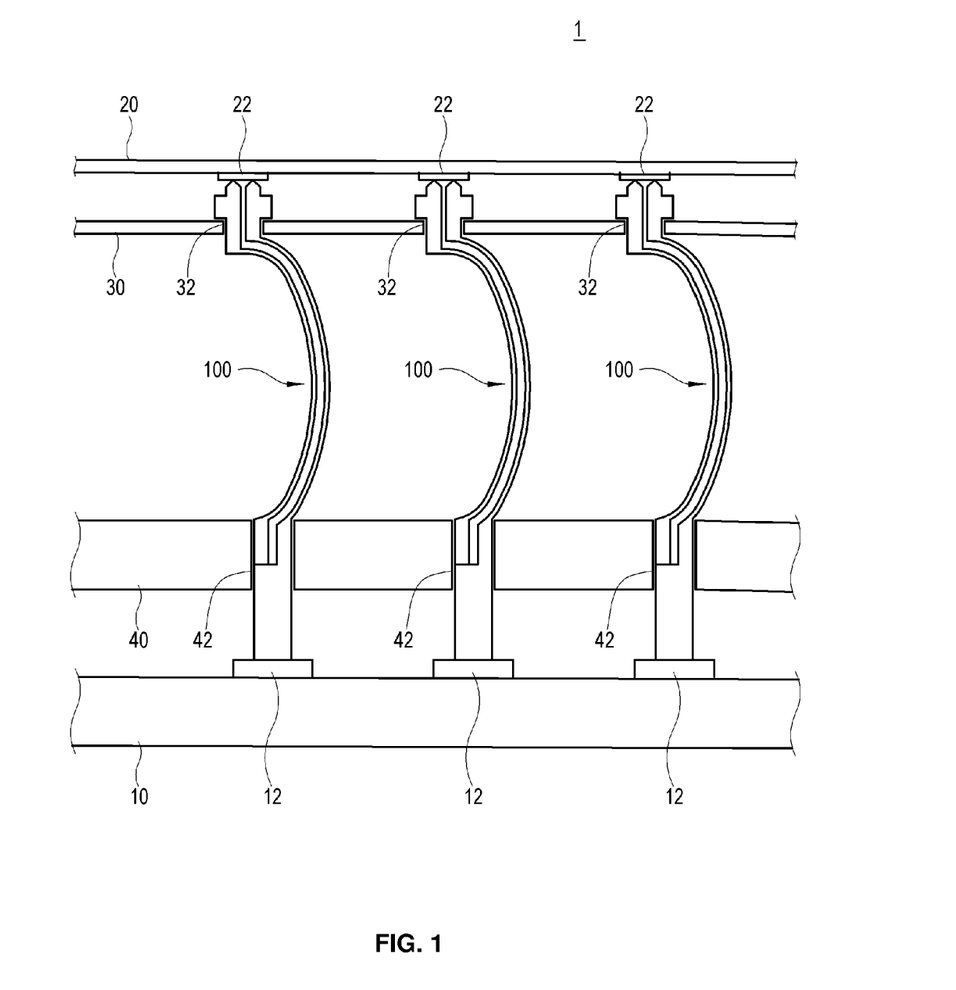
FIG. 1 is a cross-sectional view of a test device using test probes according to a first embodiment of the present disclosure.
Figure 2:
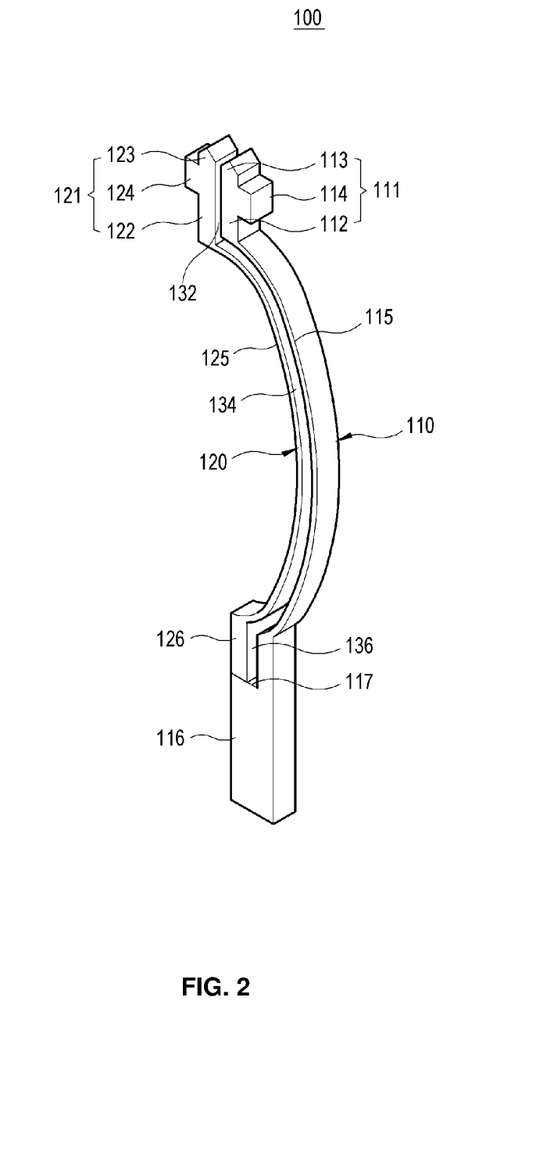
FIG. 2 is a perspective view of a test probe of FIG. 1.
Figure 3:
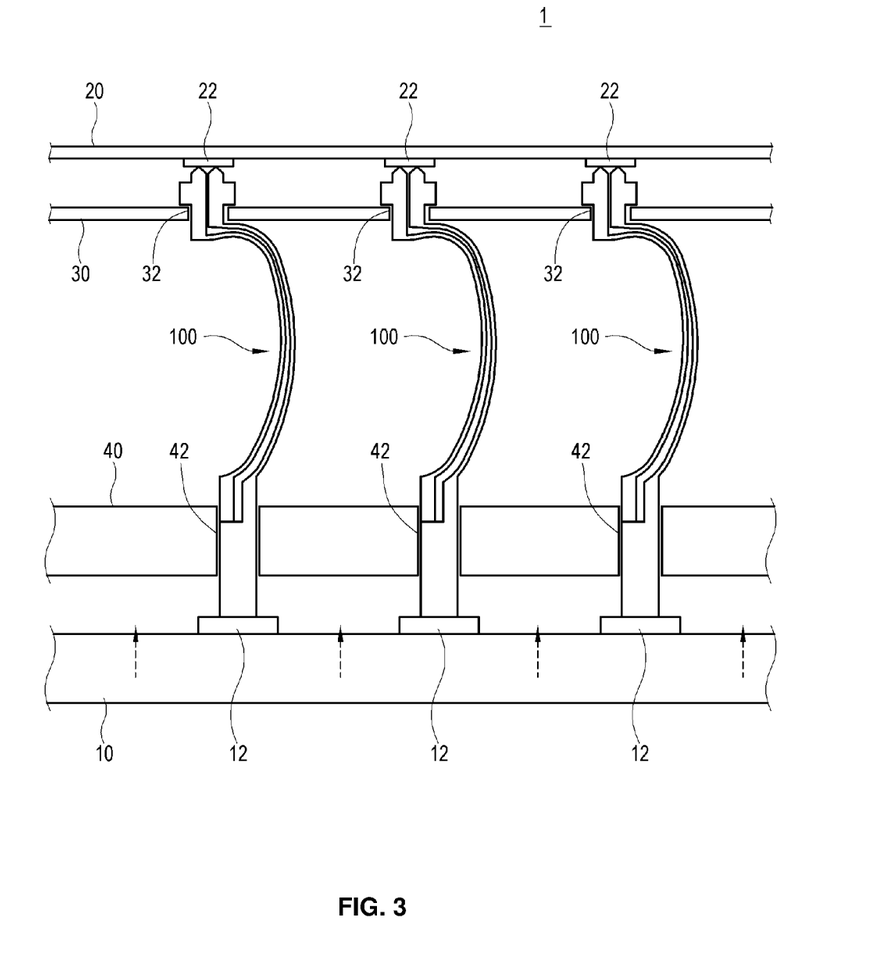
FIG. 3 is a cross-sectional view of showing an operational state of the test device of FIG. 1 during a test.

FIG. 1 is a cross-sectional view of a test device 1 using test probes according to a first embodiment of the present disclosure, FIG. 2 is a perspective view of the test probe 100 of FIG. 1, and FIG. 3 is a cross-sectional view of showing that the test probe 100 of FIG. 1 is pressed against an object 10 to be tested during the test. As shown therein, the test device 1 includes a first support member 30 having a plurality of terminal holes 32, a second support member 40 arranged in parallel with the first support member 30 and having a plurality of plurality of guide holes 42, and a plurality of test probe 100.

The first support member 30 is provided as an insulating member shaped like a plate, and has the plurality of terminal holes 32 in which first ends of the main contact probe 110 and the sub contact probe 120 are respectively inserted.

The second support member 40 is arranged in parallel with the first support member 30 leaving a space therebetween. The second support member 40 is provided as an insulating member shaped like a plate, and has the plurality of guide holes 42 in which second ends of the main contact probe 110 and the sub contact probe 120 are respectively inserted.

The test probe 100 is provided as a conductive member shaped like a plate having a predetermined thickness and electrically connects two contact points, for example, a terminal 12 of an object 10 to be tested and a pad terminal 22 of an interposer 20. Of course, the test probe 100 may be applied for the purpose of electrically connecting any two contact points as well as the electric connection between the object 10 to be tested and the interposer 20. The test probe 100 may be provided as a single layer or multiple layers with palladium (Pd) alloy, Nickel (Ni) alloy, gold (Au), platinum (Pt), silver (Ag), copper (Cu), aluminum (Al), iron (Fe), beryllium (Be), rhodium (Rh), and the like conductive material without limitations. Below, it will be described by way of example that the test probe 100 is used for the connection between the object 10 to be tested and the interposer 20.

As shown in FIG. 2, the test probe 100 includes the main contact probe 110, the opposite ends of which are inserted in the terminal hole 32 and the guide hole 42, and the sub contact probe 120, the opposite ends of which are inserted together with the main contact probe 110 into the terminal hole 32 and the guide hole 42. The main contact probe 110 and the sub contact probe 120 are separated leaving a space based on slots 132, 134 and 136. The slots 132,134 and 136 include a first slot 132 between a main terminal contact portion 111 and a sub terminal contact portion 121, a second slot 134 between a main elastic deformation portion 115 and a sub elastic deformation portion 125, and a third slot 136 between a main sliding contact portion 116 and a sub sliding contact portion 126. The first to third slots 132, 134 and 136 are communicating with each other. FIGS. 1 to 3 illustrate one sub contact probe 120, but two or more sub contact probes may be arranged together with the main contact probe leaving predetermined slots therebetween.

The main contact probe 110 includes the main terminal contact portion 111 inserted in the terminal hole 32 of the first support member 30 between the first support member 30 and the second support member 40 and protruding to be in contact with a pad terminal 22 of the interposer 20 targeted for contact, the main sliding contact portion 116 inserted in the guide hole 42 of the second support member 40 between the first support member 30 and the second support member 40 and protruding to be in contact with a terminal 12 of the object 10 to be tested and targeted for contact, and the main elastic deformation portion 115 deformed by compression in a specific direction during a test between the main terminal contact portion 111 and the main sliding contact portion 116.

The main terminal contact portion 111 includes a contact main body 112 inserted in the terminal hole 32 and linearly extended toward the pad terminal 22, a contact tip 113 sharply protruding from the end of the contact main body 112, and a projection 114 transversely protruding from the contact main body 112. The contact tip 113 is pressed against and in contact with the pad terminal 22 within the terminal hole 32 during the test. The projection 114 restrictively prevents the contact main body 112 from being pulled out of the terminal hole 32.

The main elastic deformation portion 115 is connected as a single body to the main terminal contact portion 111. The main elastic deformation portion 115 is curved having a curvature with regard to a probe axis. Of course, there are no limits to the curved shape of the main elastic deformation portion 115. Alternatively, the main elastic deformation portion 115 may be not curved. During the test, the main elastic deformation portion 115 is elastically deformed in a curvature direction by compression transferred through the main sliding contact portion 116.

The main sliding contact portion 116 is connected as a single body to the main elastic deformation portion 115. The main sliding contact portion 116 is urged as its end is in contact with the terminal 12 of the object 10 to be tested. The main sliding contact portion 116 is urged by the compression to slide and move toward the pad terminal 22 within the guide hole 42 during the test, and slides and returns to be separated from the pad terminal 22 when the compression is released. The main sliding contact portion 116 has a stepped portion 117 disposed within the guide hole 42, i.e. the thickness width of the second support member 40. The stepped portion 117 is in contact with the end of the sub sliding contact portion 126 of the sub contact probe 120. Therefore, the main sliding contact portion 116 is urged to slide within the guide hole 42 and push the sub contact probe 120 toward the pad terminal 22 of the interposer 20 during the test. Of course, the stepped portion 117 has to be disposed within the guide hole 42 of the second support member 40 even during the test.

The sub contact probe 120 includes the sub terminal contact portion 121 inserted in the terminal hole 32 of the first support member 30 and protruding to be in contact with the pad terminal 22 of the interposer 20 targeted for contact, the sub sliding contact portion 126 inserted in the guide hole 42 of the second support member 40 and protruding to be in contact with the terminal 12 of the object 10 to be tested and targeted for contact, and the sub elastic deformation portion 125 deformed in a specific direction by the compression applied through the stepped portion 117 of the main sliding contact portion 116 during the test between the sub terminal contact portion 121 and the sub sliding contact portion 126.

The sub terminal contact portion 121 includes a contact main body 122 inserted together with the main terminal contact portion 111 into the terminal hole 32 and linearly extended toward the pad terminal 22, a contact tip 123 sharply protruding from the end of the contact main body 122, and a projection 124 transversely protruding from the contact main body 122. The contact tip 123 is pressed against and in contact with the pad terminal 22 during the test. The projection 124 restrictively prevents the contact tip 123 from being pulled out of the terminal hole 32.

The sub elastic deformation portion 125 is connected as a single body to the sub terminal contact portion 121. The sub elastic deformation portion 125 is shaped similarly to the main elastic deformation portion 115 and curved having a curvature with regard to a probe axis. Of course, there are no limits to the curved shape of the sub elastic deformation portion 125. Alternatively, the sub elastic deformation portion 125 may be not curved but linear. The sub elastic deformation portion 125 is elastically deformed in a curvature direction by the compression transferred to the sub sliding contact portion 126 through the stepped portion 117 of the main elastic deformation portion 115 during the test.

The sub sliding contact portion 126 is connected as a single body to the sub elastic deformation portion 125. The sub sliding contact portion 126 is urged being in contact with the stepped portion 117 of the main elastic deformation portion 115. The sub sliding contact portion 126 moves toward the pad terminal 22 within the guide hole 42 by the compression during the test, or slides returning to the original position when the compression is released. The sub sliding contact portion 126 is extended toward the stepped portion 117 of the main elastic deformation portion 115 within the guide hole 42 of the second support member 40. Therefore, the sub sliding contact portion 126 moves toward the pad terminal 22 of the interposer 20 by force transferred through the stepped portion 117 of the main elastic deformation portion 115 when the main sliding contact portion 116 is urged to slide within the guide hole 42 during the test.

Referring to FIG. 1, when the terminal 12 of the object 10 to be tested is pressed against and in contact with the end of the main sliding contact portion 116, the main elastic deformation portion 115 and the sub elastic deformation portion 125 are deformed in the curvature direction and pushes the main terminal contact portion 111 and the sub terminal contact portion 121 toward the pad terminal 22 of the interposer 20, thereby achieving the contact.

During the test, when the terminal 12 of the object 10 to be tested, for example, the semiconductor is pressed against and in contact with the end of the main sliding contact portion 116 of FIG. 3, the main sliding contact portion 116 slides within the guide hole 42 and moves toward the pad terminal 22. In this case, the sub sliding contact portion 126 being in contact with the stepped portion 117 of the main sliding contact portion 116 also slides within the guide hole 42 and moves toward the pad terminal 22 by the compression. The sliding movement of the main sliding contact portion 116 and sub sliding contact portion 126 causes each of the main elastic deformation portion 115 and the sub elastic deformation portion 125 to be elastically deformed in the curvature direction. The elastic deformation of the main elastic deformation portion 115 and sub elastic deformation portion 125 causes the main terminal contact portion 111 and the sub terminal contact portion 121 to be pushed in a direction opposite to an elastic deformation direction and pressed against and in contact with the pad terminal 22 of the interposer 20. In this case, the first and second slots 132 and 134 get narrower. The first and second slots 132 and 134 absorb force caused by the deformation of the main elastic deformation portion 115 and the sub elastic deformation portion 125 and directly applied to the first support member 30, and thus minimize bad effects. Further, both the contact tips 113 and 123 of the main terminal contact portion 111 and the sub terminal contact portion 121 are in contact with the pad terminal 22 of the interposer 20 to thereby reduce a contact error, lower contact resistance, and achieve easy replacement even one of them is defective.

Figure 4:
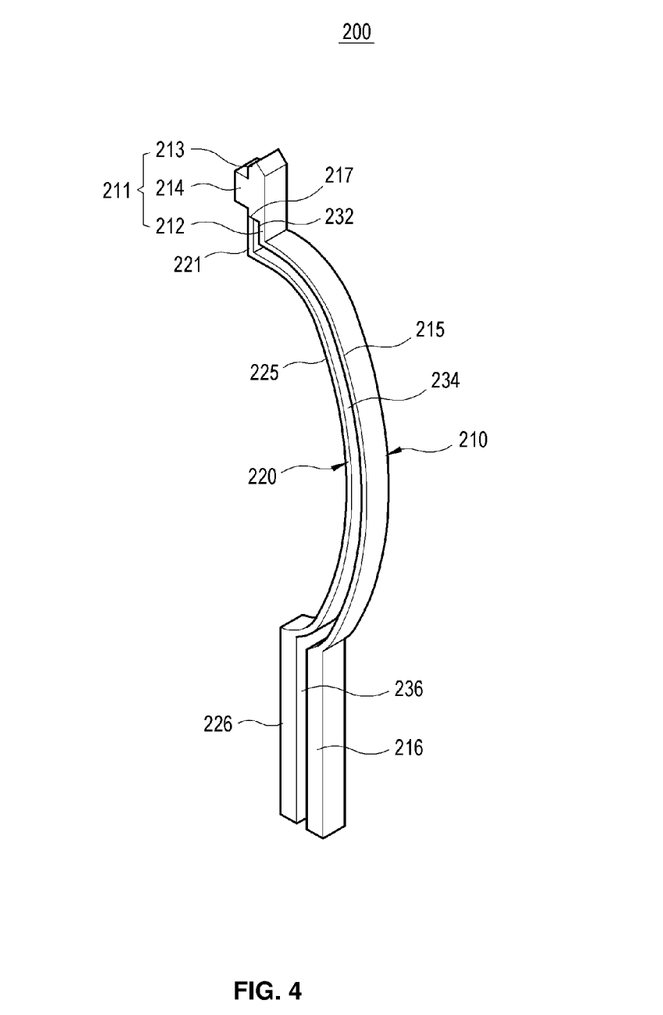
FIG. 4 is a perspective view of a test probe according to a second embodiment of the present disclosure.

FIG. 4 is a perspective view of a test probe 200 according to a second embodiment of the present disclosure. The test probe 200 is provided as a conductive member shaped like a plate having a predetermined thickness, and electrically connects two contact points, for example, the terminal 12 of the object 10 to be tested and the pad terminal 22 of the interposer 20. Of course, the test probe 200 may be applied for the purpose of electrically connecting any two contact points as well as the electric connection between the object 10 to be tested and the interposer 20.

The test probe 200 includes a main contact probe 210, the opposite ends of which are inserted in the terminal hole 32 and the guide hole 42, and a sub contact probe 220, the opposite ends of which are inserted together with the main contact probe 210 into the terminal hole 32 and the guide hole 42. The main contact probe 210 and the sub contact probe 220 are separated leaving a space based on slots 232, 234 and 236, or may be optionally in contact with each other. The slots 232, 234 and 236 include a first slot 232 between a main terminal contact portion 211 and a sub terminal contact portion 221, a second slot 234 between a main elastic deformation portion 215 and a sub elastic deformation portion 225, and a third slot 236 between a main sliding contact portion 216 and a sub sliding contact portion 226. The first to third slots 232, 234 and 236 are communicating with each other.

The main contact probe 210 includes the main terminal contact portion 211 inserted in the terminal hole 32 of the first support member 30 and protruding to be in contact with the pad terminal 22 of the interposer 20 targeted for contact at one side, the main sliding contact portion 216 inserted in the guide hole 42 of the second support member 40 and protruding to be in contact with the terminal 12 of the object 10 to be tested and targeted for contact at the other side, and the main elastic deformation portion 215 deformed by compression in a specific direction during a test between the main terminal contact portion 211 and the main sliding contact portion 216.

The main terminal contact portion 211 includes a contact main body 212 inserted in the terminal hole 32 and linearly extended toward the pad terminal 22, a contact tip 213 sharply protruding from the end of the contact main body 212, and a projection 214 transversely protruding from the contact main body 222. The contact main body 212 is elastically movable toward the pad terminal 22 within the terminal hole 32 during the test. The contact main body 212 includes a stepped portion 217 to be in contact with an end of a sub end portion 221 of the sub contact probe 220.

The contact tip 213 is pressed against and in contact with the pad terminal 22 during the test. The projection 214 restrictively prevents the contact main body 212 from being pulled out of the terminal hole 32 in a direction toward the main sliding contact portion 216.

The main elastic deformation portion 215 is connected as a single body to the main terminal contact portion 211. The main elastic deformation portion 215 is curved having a curvature with regard to a probe axis. Of course, there are no limits to the curved shape of the main elastic deformation portion 215. Alternatively, the main elastic deformation portion 215 may be not curved but linear. During the test, the main elastic deformation portion 215 is elastically deformed in a curvature direction by compression transferred through the main sliding contact portion 216. Further, the contact main body 212 of the main elastic deformation portion 215 may be pressed against by the sub end portion 221 of the sub contact probe 220.

The main sliding contact portion 216 is connected as a single body to the main elastic deformation portion 215. The main sliding contact portion 216 is urged being in contact with the terminal 12 of the object 10 to be tested. The main sliding contact portion 216 is urged by the compression to slide and move close to or away from the main terminal contact portion 211 within the guide hole 42 during the test. Therefore, the main sliding contact portion 216 is urged to slide within the guide hole 42 and push the sub contact probe 220 toward the pad terminal 22 of the interposer 20 during the test.

The sub contact probe 220 includes the sub end portion 221 inserted in the terminal hole 32 of the first support member 30 and having the end being in contact with the stepped portion 217 of the main terminal contact portion 211, the sub sliding contact portion 226 inserted in the guide hole 42 of the second support member 40 and protruding to be in contact with the terminal 12 of the object 10 to be tested and targeted for contact, and the sub elastic deformation portion 225 deformed by the compression applied through the end of the sub sliding contact portion 226 during the test between the sub end portion 221 and the sub sliding contact portion 226.

The sub end portion 221 includes the end 223 inserted together with the main terminal contact portion 211 into the terminal hole 32, and linearly extended toward the pad terminal 22 and contacting the stepped portion 217 of the main terminal contact portion 211. The sub end portion 221 is disposed together with the main terminal contact portion 211 within the terminal hole 32.

The sub elastic deformation portion 225 is connected as a single body to the sub end portion 221. The sub elastic deformation portion 225 is arranged being separated from the main elastic deformation portion 215 by the second slot 234. The sub elastic deformation portion 225 is shaped similarly to the main elastic deformation portion 215 and curved having a curvature with regard to a probe axis. Of course, there are no limits to the curved shape of the sub elastic deformation portion 225. Alternatively, the sub elastic deformation portion 225 may be not curved but linear. The sub elastic deformation portion 225 is elastically deformed in a curvature direction by the compression transferred through the sub sliding contact portion 226 during the test.

The sub sliding contact portion 226 is connected as a single body to the sub elastic deformation portion 225. The sub sliding contact portion 226 is disposed within the guide hole 42 as it is separated from the main sliding contact portion 216 by the third slot 236. The sub sliding contact portion 226 moves toward the pad terminal 22 within the guide hole 42 by the compression during the test, or slides returning to the original position when the compression is released. The sub sliding contact portion 226 is linearly extended within the guide hole 42 of the second support member 40. Therefore, the sub sliding contact portion 226 is urged to slide within the guide hole 42 and move toward the pad terminal 22 of the interposer 20 during the test.

During the test, when the terminal 12 of the object 10 to be tested, for example, the semiconductor is pressed against and in contact with both ends of the main sliding contact portion 216 and the sub sliding contact portion 226 of FIG. 4, the main sliding contact portion 216 and the sub sliding contact portion 226 slide within the guide hole 42 and move toward the pad terminal 22. The sliding movement of the main sliding contact portion 216 and sub sliding contact portion 226 causes each of the main elastic deformation portion 215 and the sub elastic deformation portion 225 to be elastically deformed in the curvature direction. In this case, along with the elastic deformation of the sub elastic deformation portion 225, the sub end portion 211 being in contact with the stepped portion 217 of the main terminal contact portion 211 urges the main terminal contact portion 211 to be pressed against the pad terminal 22 of the interposer 20. The elastic deformation of the main elastic deformation portion 215 and sub elastic deformation portion 225 causes the main terminal contact portion 211 and the sub end portion 221 to be pushed in a direction opposite to an elastic deformation direction and pressed against and in contact with the pad terminal 22 of the interposer 20. In this case, the first and second slots 232 and 234 get narrower. The first and second slots 232 and 234 absorb force caused by the deformation of the main elastic deformation portion 215 and the sub elastic deformation portion 225 and directly applied to the first support member 30, and thus minimize bad effects. Further, the main sliding contact portion 216 and the sub sliding contact portion 226 are in simultaneous contact with one terminal 12 of the object 10 to be tested the terminal 12, thereby reducing a contact error and lowering contact resistance.

Figure 5:
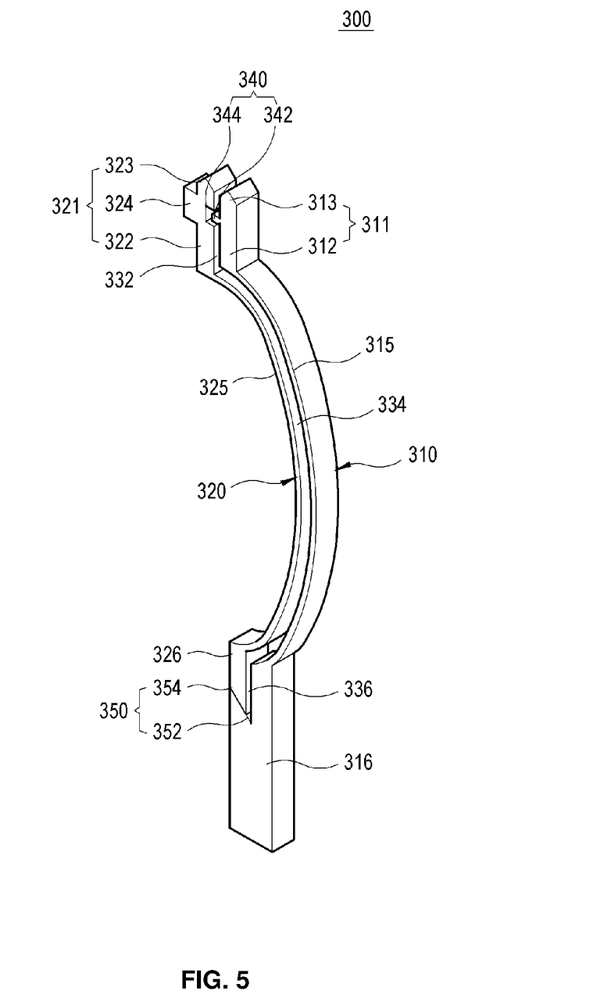
FIG. 5 is a perspective view of a test probe according to a third embodiment of the present disclosure.

FIG. 5 is a perspective view of a test probe 300 according to a third embodiment of the present disclosure. As shown therein, the test probe 300 includes a main contact probe 310 and a sub contact probe 320. The main contact probe 310 includes a main terminal contact portion 311, a main elastic deformation portion 315, and a main sliding contact portion 316. The sub contact probe 320 includes a sub terminal contact portion 321, a sub elastic deformation portion 325 and a sub sliding contact portion 326. Below, the main contact probe 310 and the sub contact probe 320 have similar structures to those of the test probe 100 of FIG. 2, and thus repetitive descriptions thereof will be avoided. The main contact probe 310 and the sub contact probe 320 are separated from each other in a lengthwise direction by first to third slots 332, 334 and 336.

The main contact probe 310 and the sub contact probe 320 include two first and second engagement portions 340 and 350. The first engagement portion 340 includes a convex (凸) portion 342 protruding from a main terminal contact portion 311 of the main contact probe 310 to a sub terminal contact portion 321 of the sub contact probe 320, and a concave (凹) portion 344 formed in the sub terminal contact portion 321 of the sub contact probe 320 and engaged with the convex (凸) portion 342. Alternatively, the first engagement portion 340 may include the convex (凸) portion 342 protruding from the sub terminal contact portion 321 of the sub contact probe 320 toward the main terminal contact portion 311 of the main contact probe 310, and the concave (凹) portion 344 formed in the main terminal contact portion 311 of the main contact probe 310 and engaged with the convex (凸) portion 342 in the sub terminal contact portion 321 of the sub contact probe 320. The second engagement portion 350 includes an inclined stepped portion 352 of the main sliding contact portion 316, and an inclined end portion 354 of the sub sliding contact portion 326, which are engaged with each other. The second engagement portion 350 has to be always within the thickness width of the second support member 40, i.e. without getting out of the guide hole 42 even though the main sliding contact portion 316 and the sub sliding contact portion 326 slides and moves. The second engagement portion 350 may have a concave-convex engagement portion instead of the inclined stepped portion 352 and the inclined end portion 354. The foregoing features of the first and second engagement portions 340 and 350 are given by way of example, and they may be engaged with each other in various ways.

Figure 6:
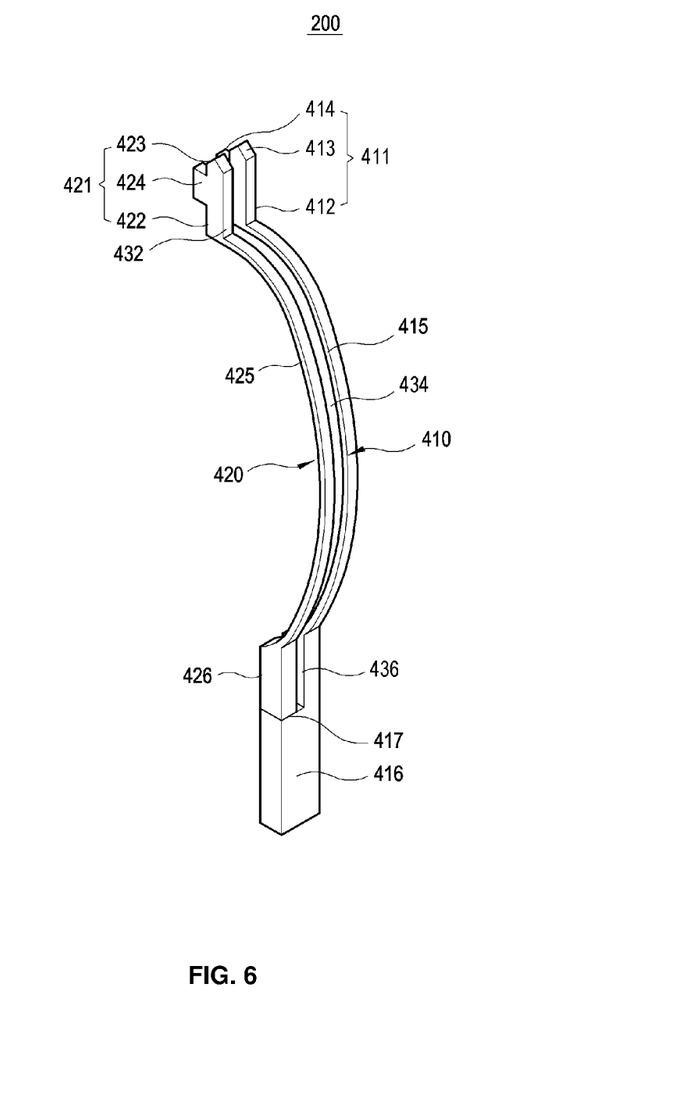
FIG. 6 is a perspective view of a test probe according to a fourth embodiment of the present disclosure.

FIG. 6 is a perspective view of a test probe 400 according to a fourth embodiment of the present disclosure. The test probe 400 according to the fourth embodiment includes a contact probe 410, and a sub contact probe 420. On the contrary to the test probes 100, 200 and 300 according to the first to third embodiments where the main contact probes 110, 210 and 310 and the sub contact probes 120, 220 and 320 are adjacently arranged along the curved surface of the elastic deformation portions 115, 125, 215, 225, 315 and 325, the test probe 400 according to the fourth embodiment includes the main contact probe 410 and the sub contact probe 420 adjacently arranged leaving a slot therebetween perpendicularly to a curved surface as shown in FIG. 6.

The test probe 400 includes the main contact probe 410, the opposite ends of which are inserted in the terminal hole 32 and the guide hole 42, and the sub contact probe 420, the opposite ends of which are inserted together with the main contact probe 410 into the terminal hole 32 and the guide hole 42.

The main contact probe 410 and the sub contact probe 420 are separated by slots 432, 434 and 436 disposed perpendicularly to the curved surface of elastic deformation portions 415 and 425. The slots 432, 434 and 436 include a first slot 432 between a main terminal contact portion 411 and a sub terminal contact portion 241, a second slot 434 between the main elastic deformation portion 415 and the sub elastic deformation portion 225, and a third slot 436 between a main sliding contact portion 416 and a sub sliding contact portion 426. The first to third slots 432, 434 and 436 are communicating with each other. FIG. 6 illustrates one sub contact probe 420, but two or more sub contact probes may be arranged along with the main contact probe.

The main contact probe 410 includes the main terminal contact portion 411 inserted in the terminal hole 32 of the first support member 30 and protruding to be in contact with the pad terminal 22 of the interposer 20 targeted for contact, the main sliding contact portion 416 inserted in the guide hole 42 of the second support member 40 and protruding to be in contact with the terminal 12 of the object 10 to be tested and targeted for contact, and the main elastic deformation portion 415 deformed by compression during a test between the main terminal contact portion 411 and the main sliding contact portion 416.

The main terminal contact portion 411 includes a contact main body 412 inserted in the terminal hole 32 and linearly extended toward the pad terminal 22, a contact tip 413 sharply protruding from the end of the contact main body 412, and a projection 414 transversely protruding from the contact main body 222. The contact main body 412 is elastically movable toward the pad terminal 22 within the terminal hole 32 during the test. The contact tip 413 is pressed against and in contact with the pad terminal 22 during the test. The projection 414 restrictively prevents the contact tip 413 from being pulled out of the terminal hole 32.

The main elastic deformation portion 415 is connected as a single body to the main terminal contact portion 411. The main elastic deformation portion 415 is curved having a curvature with regard to a probe axis. Of course, there are no limits to the curved shape of the main elastic deformation portion 415. Alternatively, the main elastic deformation portion 415 may be not curved. During the test, the main elastic deformation portion 415 is elastically deformed in a curvature direction by compression transferred through the main sliding contact portion 416.

The main sliding contact portion 416 is connected as a single body to the main elastic deformation portion 415. The main sliding contact portion 416 is urged being in contact with the terminal 12 of the object 10 to be tested. The main sliding contact portion 416 is urged by the compression to slide and move close to or away from the main terminal contact portion 411 within the guide hole 42 during the test. The main sliding contact portion 416 includes a stepped portion 417 to be positioned within the guide hole 42 of the second support member 40. The stepped portion 417 is in contact with the end of the sub sliding contact portion 426. Therefore, the main sliding contact portion 416 is urged to slide within the guide hole 42 and push the sub contact probe 420 toward the pad terminal 22 of the interposer 20 during the test.

The sub contact probe 420 includes the sub terminal contact portion 421 inserted in the terminal hole 32 of the first support member 30 and protruding to be in contact with the pad terminal 22 of the interposer 20 targeted for contact at one side, the sub sliding contact portion 426 inserted in the guide hole 42 of the second support member 40 so as to be in contact with the stepped portion 417, and the sub elastic deformation portion 425 deformed by the compression applied through the stepped portion 417 of the main sliding contact portion 416 during the test between the sub terminal contact portion 421 and the sub sliding contact portion 426.

The sub terminal contact portion 421 includes a contact main body 422 inserted together with the main terminal contact portion 411 into the terminal hole 32 and linearly extended toward the pad terminal 22, a contact tip 423 sharply protruding from the end of the contact main body 422, and a projection 424 transversely protruding from the contact main body 422.

The contact main body 422 is elastically movable within the terminal hole 32 toward the pad terminal 22 during the test. The contact tip 423 is pressed against and in contact with the pad terminal 22 during the test. The projection 424 restrictively prevents the contact tip 423 from being pulled out of the terminal hole 32.

The sub elastic deformation portion 425 is connected as a single body to the sub end portion 421. The sub elastic deformation portion 425 has the same shape as the main elastic deformation portion 415 and is curved having a curvature with regard to a probe axis. Of course, there are no limits to the curved shape of the sub elastic deformation portion 425. Alternatively, the sub elastic deformation portion 425 may be not curved. The sub elastic deformation portion 425 is elastically deformed in a curvature direction by the compression transferred through the stepped portion 417 of the main elastic deformation portion 415 during the test.

The sub sliding contact portion 426 is connected as a single body to the sub elastic deformation portion 425. The sub sliding contact portion 426 is urged as its end is in contact with the stepped portion 417 of the main elastic deformation portion 415. The sub sliding contact portion 426 slides within the guide hole 42 and moves close to and away from the sub terminal contact portion 421 by the compression during the test. The sub sliding contact portion 426 is in contact with the stepped portion 417 of the main elastic deformation portion 415 within the guide hole 42 of the second support member 40. Therefore, the sub sliding contact portion 426 slides and moves within the guide hole 42 by force transferred through the stepped portion 417 of the main elastic deformation portion 415 during the test.

The test device according to the present disclosure has effects as follows.

First, contact reliability is improved through multi contact with the terminal of the interposer or the object to be tested.

Second, one of the main contact probe and the sub contact probe is easily replaceable in the probe even though it is defective or damaged, thereby increasing the lifespan of the whole test device.

Third, compression and deformation force is partially absorbed by the slot between the main contact probe and the sub contact probe in order to reduce force applied to the support member for supporting the test probe, thereby enhancing overall test reliability.

Fourth, deformation is easily achieved by split deformation portions to thereby improve durability.

Although the present disclosure is described through a few exemplary embodiments and drawings, the present invention is not limited to the foregoing exemplary embodiments and it will be appreciated by a person having an ordinary skill in the art that various modifications and changes can be made from these embodiments.

Therefore, the scope of the present disclosure has to be defined by not the exemplary embodiments but appended claims and the equivalents.

REFERENCE NUMERALS

10: object to be tested
20: interposer
30: first support member
40: second support member
100,200,300,400: test probe
110,210,310,410: main contact probe
111,211,311,411: main terminal contact portion
115,215,315,415: main elastic deformation portion
116,216,316,416: main sliding contact portion
120,220,320,420: sub contact probe
121,221,321,421: sub terminal contact portion
125,225,325,425: sub elastic deformation portion
126,226,326,426: sub sliding contact portion
132,134,136,232,234,236,332,334,336,432,434,436: slot.

What is claimed is:

1. A test device for testing electric characteristics of an object to be tested, the test device comprising:
 a first support member comprising a plurality of terminal holes;
 a second support member comprising a plurality of guide holes and arranged to be spaced apart from and in parallel with the first support member; and
 a plurality of test probes, each said test probe comprising:
  a main contact probe comprising a main sliding contact portion slidably inserted in the guide hole, a main terminal contact portion disposed at an opposite side from the main sliding contact portion and inserted in the terminal hole, and a main elastic deformation portion connecting the main sliding contact portion and the main terminal contact portion and elastically deformed when the test probe is compressed in a lengthwise direction; and
  one or a plurality of sub contact probes each comprising a sub sliding contact portion disposed adjacent to and in parallel with the main sliding contact portion and slidably inserted in the guide hole, a sub terminal contact portion disposed adjacent to and in parallel with the main terminal contact portion and inserted in the terminal hole, and a sub elastic deformation portion connecting the sub sliding contact portion and the sub terminal contact portion, disposed adjacent to and in parallel with the main elastic deformation portion and elastically deformed when the test probe is compressed in a lengthwise direction,
 wherein the main terminal contact portion and the sub terminal contact portion are separated by a first slot formed in a lengthwise direction,
 wherein the main elastic deformation portion and the sub elastic deformation portion are separated by a second slot formed in a lengthwise direction, the second slot extended from and connected to the first slot.

2. The test device according to claim 1, wherein the main contact probe and the sub contact probe comprise an engagement portion configured to engage the first support member and the second support member to each other.

3. The test device according to claim 2, wherein the sub contact probe is compressed by the engagement portion within the thickness of at least one of the first support member and the second support member when the main contact probe is compressed.

4. A test device for testing electric characteristics of an object to be tested, the test device comprising:
 a first support member comprising a plurality of terminal holes;
 a second support member comprising a plurality of guide holes and arranged to be spaced apart from and in parallel with the first support member; and
 a plurality of test probes, each said test probe comprising:
  a main contact probe comprising a main sliding contact portion slidably inserted in the guide hole, a main terminal contact portion disposed at an opposite side from the main sliding contact portion and inserted in the terminal hole, and a main elastic deformation portion connecting the main sliding contact portion and the main terminal contact portion and elastically deformed when the test probe is compressed in a lengthwise direction; and
  one or a plurality of sub contact probes each comprising a sub sliding contact portion disposed adjacent to and in parallel with the main sliding contact portion and slidably inserted in the guide hole, a sub terminal contact portion disposed adjacent to and in parallel with the main terminal contact portion and inserted in the terminal hole, and a sub elastic deformation portion connecting the sub sliding contact portion and the sub terminal contact portion, disposed adjacent to and in parallel with the main elastic deformation portion and elastically deformed when the test probe is compressed in a lengthwise direction,
 wherein the main sliding contact portion and the sub sliding contact portion are separated by a first slot formed in a lengthwise direction,
 wherein the main elastic deformation portion and the sub elastic deformation portion are separated by a second slot formed in a lengthwise direction, the second slot extended from and connected to the first slot.

* * * * *